United States Patent [19]
Young

[11] Patent Number: 6,081,141
[45] Date of Patent: Jun. 27, 2000

[54] HIERARCHICAL CLOCK FREQUENCY DOMAINS FOR A SEMICONDUCTOR DEVICE

[75] Inventor: Ian A. Young, Portland, Oreg.

[73] Assignee: Intel Corporation, Santa Clara, Calif.

[21] Appl. No.: 08/979,998

[22] Filed: Nov. 26, 1997

[51] Int. Cl.$^7$ ..................................................... H03B 19/00

[52] U.S. Cl. ............................................ 327/116; 327/119

[58] Field of Search ..................................... 327/116, 119, 327/120, 121, 122, 123, 105, 106, 107, 295, 297, 564, 565

[56] References Cited

U.S. PATENT DOCUMENTS

| | | | |
|---|---|---|---|
| 5,548,249 | 8/1996 | Sumita et al. | 327/107 |
| 5,786,732 | 7/1998 | Nielson | 327/105 |
| 5,821,785 | 10/1998 | Glass et al. | 327/107 |
| 5,920,211 | 7/1999 | Anderson et al. | 327/105 |

*Primary Examiner*—Toan Tran
*Attorney, Agent, or Firm*—Blakely, Sokoloff, Taylor & Zafman LLP

[57] ABSTRACT

The invention in one embodiment is a semiconductor device including a logic unit capable of receiving a first clock signal having a first frequency and generating from the first clock signal a second clock signal having a second frequency higher than the first frequency.

27 Claims, 4 Drawing Sheets

HIERARCHICAL CLOCK FREQUENCY DOMAINS FOR A SEMICONDUCTOR DEVICE

BACKGROUND OF THE INVENTION

1. Field of the Invention

The invention relates generally to clock frequencies in processors and, more particularly, to hierarchical clock frequency domains for processor core logic functional units.

2. Description of the Related Art

Computers typically include a number of electronic circuits referred to as "clocks" that generate electrical "timing" or "clock" signals. Clock signals are used to control and coordinate the activities of the computer's various parts. One of the clock signals, the "system" clock signal, is a master clock signal to which the various parts of the computer synchronize their operation. The computer's parts frequently include "device" clocks generating a clock signal synchronized to the system clock. Because the device clocks are synchronized to the system clock, operations in the various parts can all be coordinated.

For instance, the computer might include a processor that directs the computer's operations and a memory controller that reads and writes information to and from a memory in response to directions from the processor. The computer generates the system clock signal that both the processor and the memory controller receive. The processor and memory controller usually run faster, i.e., operate a higher clock frequency, than does the system clock. To this end, the processor and memory controller include device clocks that generate a device clock signal synchronized to the system clock. The system clock signal therefore provides a common timing signal to which all the device clocks relate such that the operation of the various parts can be coordinated.

Many of the computer's parts, such as the processor itself, include, among other things, a number of logic units. Each logic unit performs some function necessary or desirable to the overall operation. In synchronous designs, the function of the logic units is also coordinated, or synchronized, by timing signals. However, at this level, all functions are typically performed relative to the device clock. The device generates the device clock and globally distributes it across the chip to all the core logic units. The functions of all the logic units can then be coordinated within the device since they are timed by the same clock signal.

Current techniques for fabricating synchronous devices such as processors have introduced new timing problems for device manufacturers. Evolving fabrication techniques have decreased the size of the devices and increased their operating speeds. Each generation of process technology seeks to increase the operating speed, i.e., frequency, while decreasing the size of the design. However, frequency does not necessarily scale upwardly as the size scales downwardly because of differing design factors.

Two factors affecting frequency are interconnect delay and logic gate delay. In synchronous designs, core logic units typically comprise state elements and logic elements. For instance, a core logic unit might comprise a latch through which data is input, several logic gates through which the input data is processed, and a latch through which the processed data is output. Each gate through which the data is processed introduces some amount of delay in the data throughput. This delay is the logic gate delay. The conductive material, or lines, through which the data is transmitted also introduces delay in the data throughput. This delay is known as the interconnect delay and varies depending on a number of factors such as the length and width of the lines.

The interconnect delay and the logic gate delay significantly impact the data throughput of the core logic unit. Further, the data typically must be processed through the logic unit in a single cycle of the device clock. Interconnect delay and logic gate delay therefore directly impact the frequency of the device clock by limiting it to the amount of time necessary to accomplish the data throughput. This problem is exacerbated in synchronous designs. Since all the logic units must synchronize their operation, they must receive input and output data at the same time regardless of how fast the data is processed. Thus, the logic unit with the fastest throughput can operate no faster than the logic unit with the slowest throughput.

One way to avoid some of this problem is to use asynchronous designs. In an asynchronous design, logic units are no longer required to synchronize their operations. The faster logic units are therefore free to operate at their individual data throughput. The faster logic units then have to wait on the slower logic units only periodically rather than at every clock cycle. However, asynchronous designs are very complex relative to synchronous designs. Asynchronous designs therefore are more expensive to design and manufacture. They also require larger amounts of space on the device. Since a device has only a limited amount of space in which to implement all its functions, asynchronous design can limit the performance of a device relative to a synchronous design. Asynchronous designs are therefore generally less acceptable than are synchronous designs.

Reducing interconnect and logic gate delay consequently intensely interests device designers. There are several satisfactory approaches to reducing logic gate delay, but the problem of interconnect delay has proven more intractable. Interconnect delay for the same line or net length does not decrease as the line width is scaled down to decrease size. The interconnect delay actually worsens. Existing solutions for the interconnect delay problem are all deficient in some respect and even the most promising of these solutions is viable for only a single processing generation.

Thus, the interconnect delay hampers the designer's ability to scale up the frequency at the same rate they scale down the size of the device. This fact, in turn, hampers efforts to increase overall performance in terms of size and speed. The present invention is directed to overcoming, or at least reducing the effects of, one or more of the problems set forth above.

SUMMARY OF THE INVENTION

The invention in one embodiment is a semiconductor device including a logic unit capable of receiving a first clock signal having a first frequency and generating from the first clock signal a second clock signal having a second frequency higher than the first frequency.

BRIEF DESCRIPTION OF THE DRAWINGS

Other objects and advantages of the invention will become apparent upon reading the following detailed description and upon reference to the drawings in which.

Figure 1:
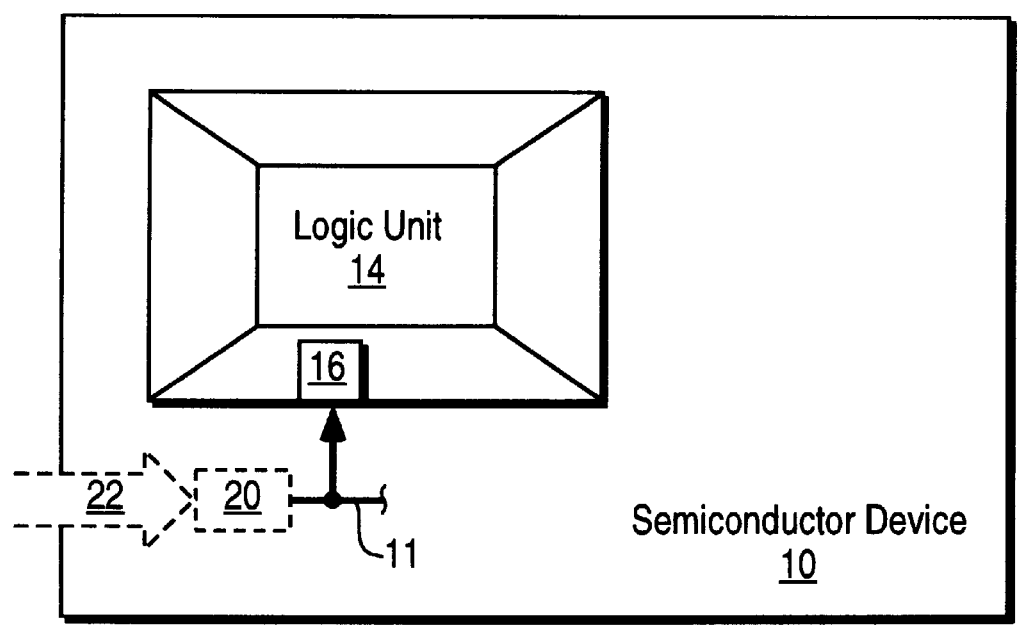
FIG. 1 illustrates one particular embodiment of the invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

FIG. 1 illustrates one particular embodiment of the invention in which a semiconductor device 10 generally comprises a line 11 and a logic unit 14 capable of receiving from the line 11 a first clock signal. The line 11 may, in some embodiments, comprise separate timing and logic buses although this is not necessary to the practice of the invention. In operation, a first clock signal is distributed globally across the device 10 via the line 11 and shall hereafter consequently be referred to as the "global" clock signal. The global clock signal may be generated by an on-chip clock generator 20 or, alternatively, may be an external clock signal received on an input 22, both shown in ghosted lines in FIG. 1. One external clock signal suitable for this purpose is the system clock signal. The global clock signal has a first frequency that shall hereafter be referred to as the global frequency.

The logic unit 14 may be any functionally complete, synchronous logic unit. In an embodiment in which the device 10 is a processor, the logic unit 14 may be any one of an arithmetic logic unit, a floating point unit, an integer execution unit, a memory management unit, a cache unit, a bus unit, a prefetch unit, an instruction decode unit, etc. Some hybrid embodiments of the logic unit 14 might even encompass more than one function. For instance, some embodiments might perform memory, execution, and instruction decode functions. However, the particular function of logic unit 14 is not so important as is its functional completeness however the function may be defined.

The logic unit 14 includes a clock synthesizer 16 through which the logic unit 14 receives the global clock signal from the line 11. The clock synthesizer 16 is capable of generating from the global clock signal a second clock signal, hereafter called the "local" clock signal, at a second frequency, hereafter called the "local" frequency, higher than the global frequency. The global and local frequencies should be separated by a factor of at least two but the local frequency may, in practice, be any integer multiple of the global frequency wherein the integer is a rational number greater than one. In one particular embodiment, the local frequency is 5.5 times the global frequency. The clock synthesizer 16 may preferably be a phase-locked loop circuit such as is known in the art, but the scope of the invention is not so limited as other types of clock synthesizers may be used. For instance, clock synthesizer 16 may be implemented using delay lines or by tapping selected phases of another clock signal in various alternative embodiments.

Figure 2:
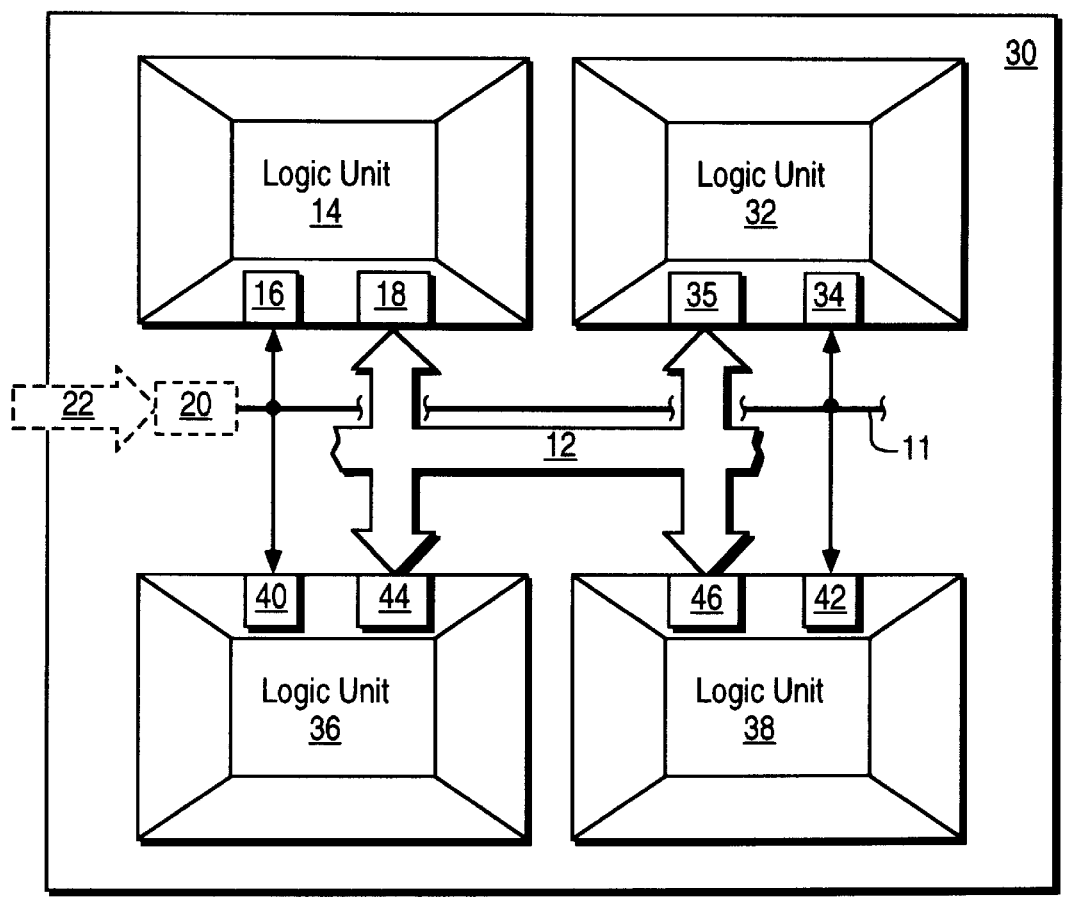
FIG. 2 illustrates an alternative embodiment extrapolated from that of FIG. 1.

FIG. 2 illustrates an embodiment of the invention extrapolated from the embodiment of FIG. 1. The embodiment of FIG. 2 is a semiconductor device 30 including the clock line 11 and one particular embodiment of the logic unit 14 of the device 10 illustrated in FIG. 1. The logic unit 14, in the particular embodiment of FIG. 2, can receive global logic signals over the bus 12 which is clocked by the global clock signal. The logic unit 14 also includes an interface unit 18 capable of "cleaning" a global logic signal received over the bus 12. The logic unit 14 is one of several similar units on semiconductor device 30 as will be discussed below, each of which communicates with the others over the bus 12. The interface unit 18 ensures that such communications are synchronized. Thus, the interface unit 18 must be skew and jitter tolerant and, in this sense, "clean" the logic signal of unwanted distortion and noise. The logic signal may be either a data signal or a control signal.

The interface unit 18 may be implemented with a first-in, first-out ("FIFO") register into which data or control information is clocked in from the bus 12 using one clock signal and from which the data or control information is clocked out using another clock signal. Typically, the information is clocked in from the bus 12 using the global clock signal and clocked out into the logic unit 14 using the local clock signal. The interface unit 18 may be bidirectional, with information clocked in from the logic unit 14 using the local clock signal and clocked out to the bus 12 using the global clock signal. However, the scope of the invention is not so limited. Other clock signals might be employed in other embodiments and the interface unit 18 may be implemented in other ways without using a FIFO register. The interface unit 18 "interfaces" the operations of the logic unit 14, which are performed at the local frequency, with those occurring outside the logic unit 14. In effect, the defined by the global clock signal and the local frequency domain defined by the local clock signal.

The device 30 of FIG. 2 also further includes an additional logic unit 32 capable of receiving the global clock signal from the line 11. The additional logic unit 32 includes an additional clock synthesizer 34 capable of generating from the global clock signal a third clock signal, which hereafter shall also be called a "local" clock signal, at a third frequency, also hereafter called a "local" frequency, higher than the global frequency. The logic unit 32 also includes an additional interface unit 35 capable of cleaning the logic signal in the same manner as the interface unit 18. The structure of the synthesizer 34 and the interface unit 35 may be the same as that of synthesizer 16 and interface unit 18, respectively. Alternatively, synthesizer 34 and interface unit 35 may be implemented using an acceptable alternative for synthesizer 16 and interface unit 18 as discussed above. Similarly, the respective local frequencies of the logic units 14 and 32 may be the same in some embodiments and different in other embodiments.

Figure 3:
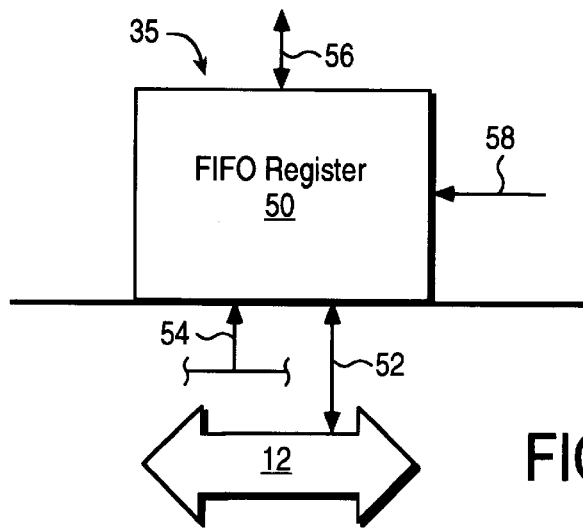
FIG. 3 depicts one embodiment of the interface unit of a logic unit in the embodiment of FIG. 2.

The interface unit 35 in this particular embodiment is illustrated in FIG. 3. The interface unit 35 is a FIFO register 50 receiving logic information from the bus 12 via an input line 52. The logic information may be either data from memory, data from other types of functional blocks, or control information. The interface unit 35 clocks in information on a line is 52 in response to a timing signal on a line 54, which in this embodiment is the global clock signal off clock line 11. The logic data is clocked out of the FIFO register 50 onto a line 56 to other parts (not shown) of logic unit 32 responsive to a clock signal received on a line 58. In this particular embodiment, the clock signal on the line 58 is the local clock signal for the logic unit 32. The interface unit 35 in this embodiment is bidirectional. Data and control information are clocked into the FIFO register 50 from other parts (not shown) of the logic unit 32 on the line 56 using the local clock signal on the line 58. Data and control information in the FIFO register 50 are then clocked out onto the bus 12 with the global clock signal received on the line 54.

Figure 4:
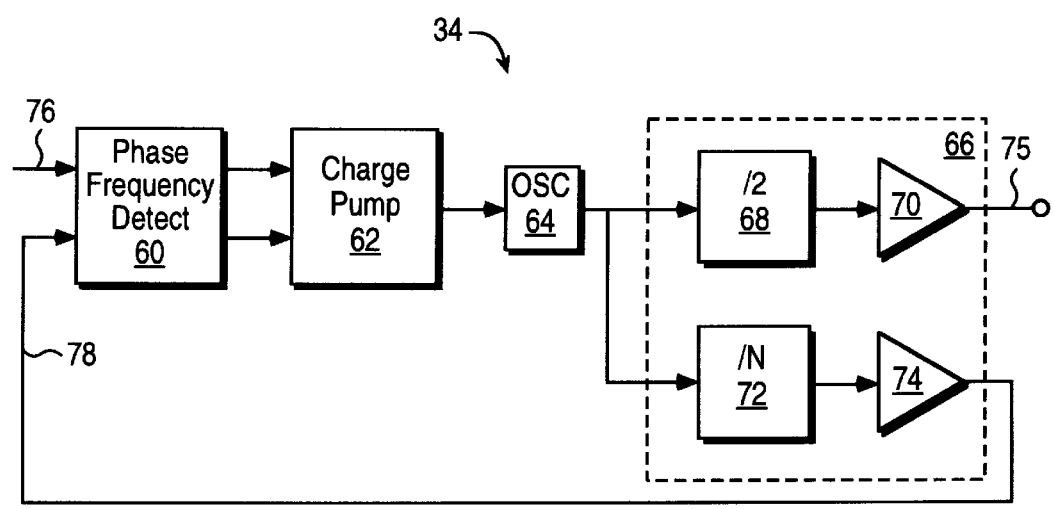
FIG. 4 depicts one embodiment of the clock synthesizer of a logic unit in the embodiment of FIG. 2.

The clock synthesizer 34 for the particular embodiment of FIG. 2 is illustrated in FIG. 4. This particular clock synthesizer 34 is one embodiment of a phased-lock loop ("PLL") circuit as is commonly known in the art. The clock synthesizer 34 includes a phase frequency detector 60, a charge pump 62, a voltage controlled oscillator 64, and a divider/synchronizer 66. The divider/synchronizer 66, in turn, comprises a divider circuit 68, a buffer 70, a divider circuit 72, and a buffer 74. The clock synthesizer 34 receives the low frequency global clock signal from the clock line 11 (shown in FIG. 2) on a line 76 and outputs the high frequency local clock signal on line 75 to the rest of logic unit 32. The local clock signal is output on the line 75 by the divider/synchronizer 66. The divider/synchronizer 66 also outputs a second signal on a line 78 for feedback to the phase frequency detector 60 in accord with well known PLL design principles.

Returning to the particular embodiment of FIG. 2, the device 30 also includes additional logic units 36 and 38 further comprising clock synthesizers 40 and 42, respectively, and interface units 44 and 46, respectively. Each of the logic units 14, 32, 36, and 38 may have a different local frequency and one or more might have the same local frequency depending on the particular embodiment.

The particular embodiment of FIG. 2 employs a bus architecture among the logic units 14, 32, 36, and 38. As will be appreciated by those in the art having the benefit of this disclosure, alternative embodiments might instead employ a point-to-point architecture. In a point-to-point architecture, the logic units 14, 32, 36, and 38 would communicate over uni-directional or bidirectional lines between each other rather than the bus 12 of FIG. 2. The scope of the invention therefore is not limited to a bus architecture such as that illustrated in FIG. 2.

Returning to FIG. 1, in operation, the global clock signal is distributed globally across the semiconductor device 10 via the clock line 11. The logic unit 14 receives the global clock signal via the clock line 11 and generates the local clock signal that provides timing for performing the functions of the logic unit 14. The local clock signal has a frequency higher than the frequency of the global clock signal. In the particular embodiment of FIG. 2, the logic unit 14 also interfaces with global logic signals received via the bus 12 through the interface unit 18. The interface unit 18 cleans the global logic signal by eliminating, or at least reducing, noise and distortion such as jitter and skew.

In embodiments, such as that of FIG. 2, in which multiple logic units 14, 32, 36, and 38 are present, the additional logic units 32, 36, and 38 also receive the global clock signal. In the is particular embodiment of FIG. 2, each of the logic units 14, 32, 36 and 38 generates a local clock signal having a frequency higher than that of the global clock signal and interfaces with global logic signals via the interface units 35, 44, and 46, respectively. Other embodiments might include other functionally complete logic units that operate only at the global frequency, although such embodiments are not illustrated.

Figure 5:
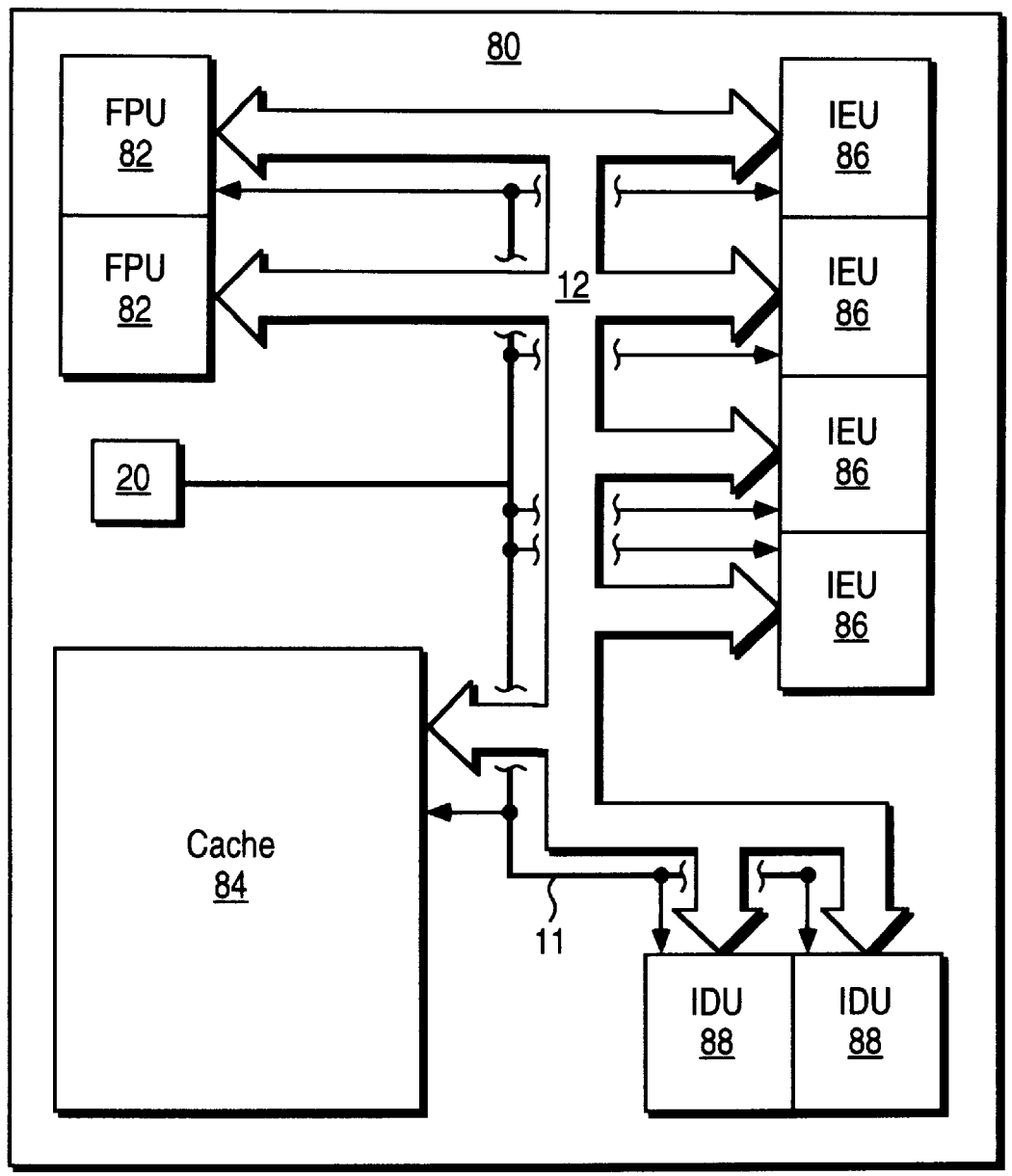
FIG. 5 conceptually illustrates one particular embodiment of the embodiment of FIG. 2.

Turning now to FIG. 5, a particular variation of the embodiment in FIG. 2 is conceptually illustrated. A processor 80 includes nine functionally complete core logic units. More particularly, processor 80 includes two floating point units 82, a cache unit 84, four integer execution units 86, and two instruction decode units 88. The global clock signal is generated by the device clock 20 and distributed to the logic units 82–88 via the clock line 11. Thus, each of the core logic units 82–88 contains a clock synthesizer such as the clock synthesizer 16 of FIG. 1. Returning to FIG. 5, each of the core logic units 82–88 may operate at the same local frequency or multiple local frequencies may be used. For instance, the floating point units 82 might operate at a first local frequency, the cache unit 84 at a second local frequency, the integer execution units 84 at a third local frequency, and the instruction decode units 88 at a fourth local frequency. Note that one or more of the local frequencies are higher than the frequency of the global clock signal. Each of the core logic units 82–88 also receives logic signals over the bus 12, and so each has an interface unit such as the logic unit 18 in FIG. 2.

Thus, the present invention implements hierarchical domains for core logic functional units of a semiconductor device. The first level of the hierarchy is defined by the global clock signal. Those portions of the semiconductor device in which the global clock signal provides the timing comprise a first, or global, frequency domain. Likewise, each local clock signal defines a second level of the hierarchy, i.e., a local frequency domain. One primary advantage of a hierarchical frequency domain architecture is particularly apparent from the embodiments of FIGS. 2 and 5. The present invention decreases interconnect delay within individual logic units by excluding the length of the interconnect of clock line 11 therefrom. Further, the throughput of the core logic units can be tailored to the local frequencies. Thus, each logic unit can operate at its own pace, thereby achieving asynchronous-type performance without sacrificing synchronous design advantages. For instance, it does not require complex asynchronous logic circuits that occupy large areas of the device and increase complexity. Finally, the invention also allows the full potential of improvements in transistor speed to be exploited by logic designers without the limitations imposed by interconnect technology. Finally, the invention reduces clock distribution power consumption.

The particular embodiments disclosed above are illustrative only as the invention may be modified and practiced in different but equivalent manners apparent to those skilled in the art having the benefit of the teachings herein. For instance, although not shown, the bus 12 of the device 30 might receive data and information over an off-chip, external bus through interface circuitry such as is commonly known and used in the art. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A device comprising:
    an integrated circuit including:
        a clock synthesizer including:
            a clock input for receiving a global clock signal having a global clock frequency;
            a clock output for transmitting a local clock signal having a local clock frequency;
        a first-in first-out register having an input clocked by the global clock signal and an output clocked by the local clock signal; and
        a local circuit with a local input coupled to the clock output for receiving the local clock signal;
    wherein the local clock frequency is different than the global clock frequency;
    wherein the local clock signal is synchronized with the global clock signal.

2. The device of claim 1, wherein the local clock frequency is higher than the global clock frequency.

3. The device of claim 1, wherein the local clock frequency is an integer multiple of the global clock frequency.

4. The device of claim 1, wherein the clock input includes circuitry for cleaning the global clock signal.

5. The device of claim 1, wherein the clock synthesizer includes a phase-locked loop circuit.

6. The device of claim 1, wherein the integrated circuit further includes an external clock input pin coupled to the clock input.

7. The device of claim 1, wherein the integrated circuit further includes an internal global clock generator with an output coupled to the clock input.

8. The device of claim 1, wherein the integrated circuit further includes a bus coupled to a data input of the first-in first-out register for transferring data to the local circuit.

9. The device of claim 1, wherein the integrated circuit includes a processor.

10. The device of claim 1, wherein the logic unit includes at least one of an arithmetic logic unit, a floating point unit, an integer execution unit, a memory management unit, a cache unit, a bus unit, a prefetch unit, and an instruction decode unit.

11. A device comprising:
    a first logic unit including:
        a first clock synthesizer including:
            a first clock input for receiving a global clock signal having a global clock frequency;
            a first clock output for transmitting a first local clock signal having a first local clock frequency;
        a first first-in first-out register having a first register input clocked by the global clock signal and a first register output clocked by the first local clock signal; and
        a first local circuit with a first local input coupled to the first clock output for receiving the first local clock signal;
    a second logic unit including:
        a second clock synthesizer including:
            a second clock input for receiving the global clock signal;
            a second clock output for transmitting a second local clock signal having a second local clock frequency;
            a second first-in first-out register having a second register input clocked by the global clock signal and a second register output clocked by the second local clock signal; and
        a second local circuit with a second local input coupled to the second clock output for receiving the second local clock signal;
    wherein the first and second local clock frequencies are each different than the global clock frequency;
    wherein the first and second local clock signals are each synchronized with the global clock signal.

12. The device of claim 11, wherein the first logic unit and the second logic unit are both included within a single integrated circuit.

13. The device of claim 11, wherein the first and second local clock frequencies are each higher than the global clock frequency.

14. The device of claim 11, wherein the first and second local clock frequencies are different from one another.

15. The device of claim 11, wherein the first and second local clock frequencies are the same as one another.

16. The device of claim 11, wherein the first and second logic units each include at least one of an arithmetic logic unit, a floating point unit, an integer execution unit, a memory management unit, a cache unit, a bus unit, a prefetch unit, and an instruction decode unit.

17. A method of distributing a clock signal, comprising:
    distributing a global clock signal with a global clock frequency;
    receiving the global clock signal by a first clock synthesizer;
    generating a first local clock signal with a first local clock frequency by the first clock synthesizer;
    distributing the first local clock signal within a first local circuit; and
    clocking data into a first-in first-out register with the global clock signal and clocking data out of the first-in first-out register with the first local clock signal;
    wherein receiving by a first clock synthesizer, generating a first local clock signal, distributing the first local clock signal and clocking data into and out of the first-in first-out register all take place within the same integrated circuit;
    wherein the first local clock signal is synchronized with the global clock signal.

18. The method of claim 17, wherein the first local clock frequency is higher than the global clock frequency.

19. The method of claim 18, wherein the first local clock frequency is an integer multiple of the global clock frequency.

20. The method of claim 17, wherein receiving the global clock signal includes cleaning the global clock signal.

21. The method of claim 17, wherein generating includes using a phase-locked loop.

22. The method of claim 17, further comprising:
    receiving the global clock signal by a second clock synthesizer;
    generating a second local clock signal with a second local clock frequency by the second clock synthesizer; and
    distributing the second local clock signal within a second local circuit;
    wherein the second local clock signal is synchronized with the global clock signal.

23. The method of claim 22, wherein receiving the global clock signal by a first clock synthesizer, generating a first local clock signal, distributing the first local clock signal, clocking data into and out of the first-in first-out register, receiving the global clock signal by a second clock synthesizer, generating a second local clock signal, and distributing the second local clock signal all take place within the same integrated circuit.

24. The method of claim 22, wherein the second local clock frequency is higher than the global clock frequency.

25. The method of claim 22, wherein the first local clock frequency is different than the second local clock frequency.

26. The method of claim 22, wherein the first local clock frequency is the same as the second local clock frequency.

27. The method of claim 22, wherein the second local clock frequency is an integer multiple of the global clock frequency.

* * * * *

UNITED STATES PATENT AND TRADEMARK OFFICE
CERTIFICATE OF CORRECTION

PATENT NO. : 6,081,141
DATED : June 27, 2000
INVENTOR(S) : Young

It is certified that error appears in the above-identified patent and that said Letters Patent is hereby corrected as shown below:

<u>Column 5,</u>
Line 3, delete "is".
Line 67, delete "is".

Signed and Sealed this

Twenty-sixth Day of March, 2002

*Attest:*

JAMES E. ROGAN
*Attesting Officer*  *Director of the United States Patent and Trademark Office*